US008462826B2

(12) United States Patent
Loopstra et al.

(10) Patent No.: US 8,462,826 B2
(45) Date of Patent: Jun. 11, 2013

(54) LASER DEVICE

(75) Inventors: Erik Roelof Loopstra, Eindhoven (NL); Gerardus Hubertus Petrus Maria Swinkels, Eindhoven (NL); Erik Petrus Buurman, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 328 days.

(21) Appl. No.: 12/683,612

(22) Filed: Jan. 7, 2010

(65) Prior Publication Data
US 2010/0182579 A1 Jul. 22, 2010

Related U.S. Application Data

(60) Provisional application No. 61/143,346, filed on Jan. 8, 2009.

(51) Int. Cl.
*H01S 3/00* (2006.01)

(52) U.S. Cl.
USPC ......... 372/38.01; 372/30; 372/76; 250/504 R; 250/492.2

(58) Field of Classification Search
USPC ........ 372/30, 38.01, 76; 123/143; 250/504 R; 355/55
See application file for complete search history.

(56) References Cited

U.S. PATENT DOCUMENTS

| 2005/0205811 | A1* | 9/2005 | Partlo et al. | 250/504 R |
|---|---|---|---|---|
| 2005/0265417 | A1* | 12/2005 | Fallon et al. | 372/55 |
| 2006/0243238 | A1* | 11/2006 | Anezaki et al. | 123/143 B |
| 2010/0117009 | A1* | 5/2010 | Moriya et al. | 250/504 R |
| 2010/0193710 | A1* | 8/2010 | Wakabayashi et al. | 250/504 R |
| 2010/0220756 | A1* | 9/2010 | Krzysztof et al. | 372/38.02 |
| 2011/0013166 | A1* | 1/2011 | Loopstra et al. | 355/67 |
| 2012/0243566 | A1* | 9/2012 | Hori et al. | 372/27 |
| 2012/0307851 | A1* | 12/2012 | Hori et al. | 372/27 |

FOREIGN PATENT DOCUMENTS

| JP | 2004-303725 | 10/2004 |
|---|---|---|
| JP | 2006-128157 | 5/2006 |
| JP | 2006-244837 | 9/2006 |
| JP | 2007-515774 | 6/2007 |
| JP | 2008-283107 | 11/2008 |
| WO | 2008/048415 | 4/2008 |
| WO | 2008/088488 | 7/2008 |

OTHER PUBLICATIONS

Japanese Office Action for Japanese Patent Application No. 2010-000046, mailed on Jul. 6, 2012.
Japanese Office Action for Japanese Patent Application No. 2010-000046, mailed on Jan. 26, 2012.

* cited by examiner

*Primary Examiner* — Tod T Van Roy
*Assistant Examiner* — Delma R Forde
(74) *Attorney, Agent, or Firm* — Pillsbury Winthrop Shaw Pittman LLP

(57) ABSTRACT

A laser device includes a seed laser, an amplifier, a detector, and an optical element arranged to direct radiation emitted by the seed laser towards a plasma generation site. The optical element is arranged to direct towards the detector amplified spontaneous emission radiation which has been emitted by the seed laser and has been reflected from a droplet of fuel material. The detector is arranged to trigger generation of a laser radiation pulse by the seed laser when the reflected amplified spontaneous emission radiation is detected.

11 Claims, 3 Drawing Sheets

LASER DEVICE

CROSS-REFERENCE TO RELATED APPLICATIONS

This application claims the benefit of priority from U.S. Provisional Patent Application No. 61/143,346, filed on Jan. 8, 2009, the entire content of which is incorporated herein by reference.

FIELD

The present invention relates to a laser device, and to a method of synchronizing a laser pulse.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source that produces extreme ultraviolet radiation having a wavelength within the range of 10-20 inn, desirably within the range of 13-14 nm. Thus, EUV radiation sources may constitute a significant step toward achieving small features printing. Such radiation is termed extreme ultraviolet or soft x-ray, and possible sources include, for example, laser produced plasma sources, discharge plasma sources, or synchrotron radiation from electron storage rings.

Typically, for a laser produced plasma (LPP) EUV source, a droplet stream of fuel material, such as tin (Sn), is heated by a strong laser beam (beam of radiation) to create a plasma that generates radiation in the EUV range. The strong laser beam may be provided by a laser device, such as a $CO_2$ laser.

Synchronization of the laser device and the droplet stream of fuel material may be difficult.

SUMMARY

According to an aspect of the invention, there is provided a laser device comprising a seed laser, an amplifier, a detector, and an optical element arranged to direct radiation emitted by the seed laser towards a plasma generation site. The optical element is arranged to direct towards the detector amplified spontaneous emission radiation which has been emitted by the seed laser and has been reflected from a droplet of fuel material. The detector is arranged to trigger generation of a laser radiation pulse by the seed laser when the reflected amplified spontaneous emission radiation is detected.

According to an aspect of the invention, there is provided a radiation source configured to produce extreme ultraviolet radiation. The radiation source includes a laser device that includes a seed laser, an amplifier, a detector, and an optical element arranged to direct radiation emitted by the seed laser towards a plasma generation site. The optical element is arranged to direct towards the detector amplified spontaneous emission radiation which has been emitted by the seed laser and has been reflected from a droplet of fuel material. The detector is arranged to trigger generation of a laser radiation pulse by the seed laser when the reflected amplified spontaneous emission radiation is detected. The radiation source includes a chamber in which in which the plasma generation site is located, and a fuel material supply constructed and arranged to supply droplets of fuel material to the plasma generation site.

According to an aspect of the invention, there is provided a lithographic projection apparatus that includes a radiation source configured to produce extreme ultraviolet radiation. The radiation source includes a laser device that includes a seed laser, an amplifier, a detector, and an optical element arranged to direct radiation emitted by the seed laser towards a plasma generation site. The optical element is arranged to direct towards the detector amplified spontaneous emission radiation which has been emitted by the seed laser and has been reflected from a droplet of fuel material. The detector is arranged to trigger generation of a laser radiation pulse by the seed laser when the reflected amplified spontaneous emission radiation is detected. The lithographic projection apparatus includes a support configured to support a patterning device, the patterning device being configured to pattern the extreme ultraviolet radiation, and a projection system configured to project the patterned extreme ultraviolet radiation onto a substrate.

According to an aspect of the invention, there is provided a method of synchronizing a laser pulse in order to irradiate a fuel material located at a plasma generation site. The method includes directing amplified spontaneous emission radiation towards the plasma generation site using one or more optical elements, detecting amplified spontaneous emission radiation which has been reflected by a droplet of fuel material, and triggering a seed laser upon detection of the reflected amplified spontaneous emission radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
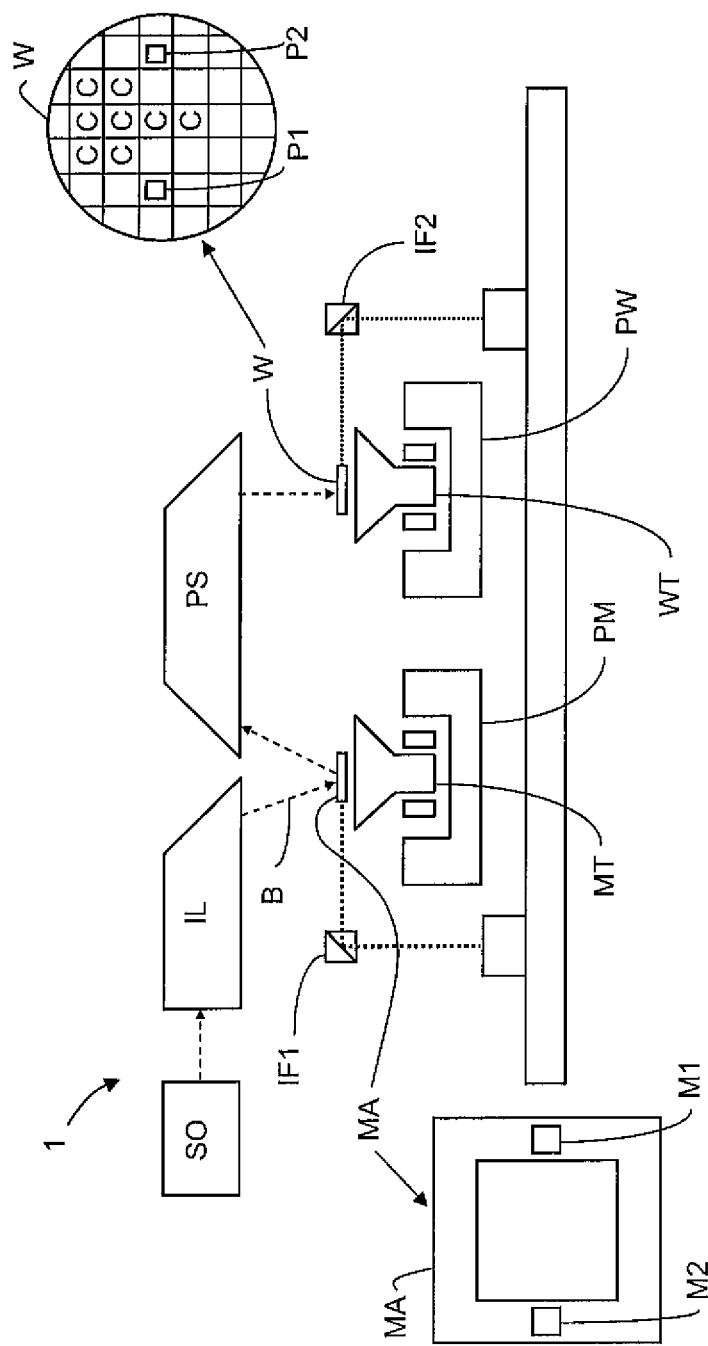
FIG. 1 depicts an embodiment of a lithographic apparatus.

FIG. 1 schematically depicts a lithographic apparatus 1 according to one embodiment of the invention. The apparatus includes: an illumination system (illuminator) IL configured to condition a radiation beam B (e.g. EUV radiation); a support structure or support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). The apparatus may however include transmissive components.

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illumination system IL receives a radiation beam from a radiation source SO. The source and the lithographic apparatus may be separate entities. In such cases, the source is not considered to form part of the lithographic apparatus and the radiation beam is passed from the source SO to the illumination system IL with the aid of a beam delivery system including, for example, suitable directing mirrors and/or a beam expander. In other cases the source may be an integral part of the lithographic apparatus, for example when the source is a mercury lamp. The source SO and the illumination system IL, together with the beam delivery system if required, may be referred to as a radiation system.

The illumination system IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illumination system IL may include various other components, such as an integrator and a condenser. The illumination system may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
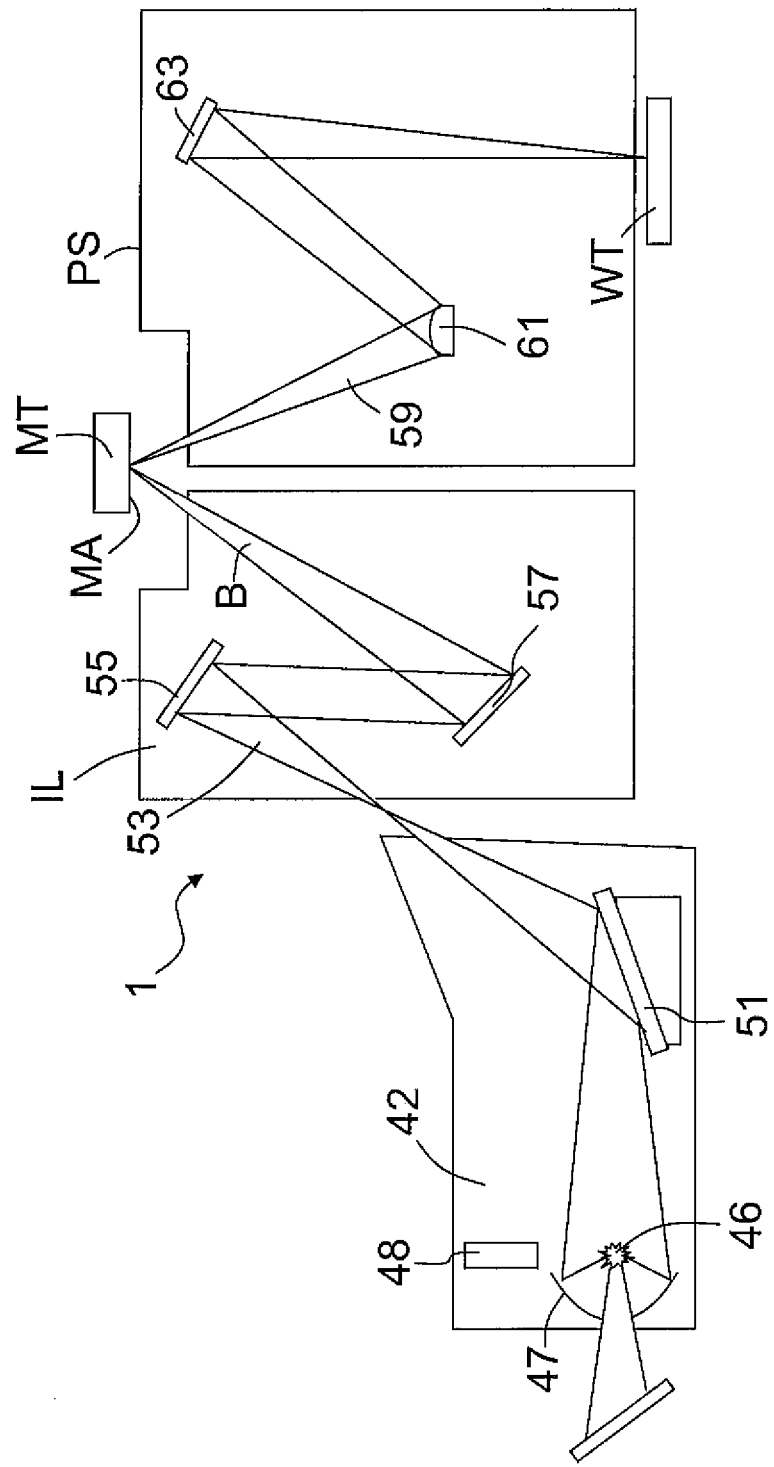
FIG. 2 depicts a radiation source of the lithographic apparatus of FIG. 1.

FIG. 2 shows the lithographic apparatus 1 in more detail, including a radiation system 42, the illumination system IL, and the projection system PS. EUV radiation may be produced by creating a plasma which is very hot and which emits radiation in the EUV range of the electromagnetic spectrum. The plasma 46 may be created by laser-irradiation of a droplet of fuel material provided by a fuel material supply 48. In an embodiment, the droplet of fuel material is Sn.

Radiation emitted by the plasma is reflected by a collector minor 47 which is configured to focus the radiation to a focal point, which in this embodiment coincides with a so-called intermediate focus. In this embodiment, the radiation is focused to the focal point via a grazing incidence mirror 51. The radiation system 42 may further comprise a contaminant barrier (not shown in the Figures). The contaminant barrier may comprise a gas barrier or a combination of a gas barrier and a channel structure.

From the radiation system 42, a beam of radiation 53 is reflected in the illumination system IL via mirrors 55, 57 onto a patterning device MA (e.g., a reticle or mask) positioned on patterning device support MT (e.g., a reticle or mask table). A patterned beam 59 is formed which is imaged in projection system PS via reflective elements 61, 63 onto substrate table WT. More elements than shown may generally be present in illumination system IL and projection system PS. Grazing incidence mirror 51 may optionally be present, depending upon the type of lithographic apparatus. The grazing incidence mirror 51 may be a grating spectral filter 51. Furthermore, there may be more mirrors present than those shown in the Figures, for example there may be one, two, three, four or yet more reflective elements present than elements 61, 63.

Instead of or in addition to a grating spectral filter 51, as schematically depicted in FIG. 2, a transmissive optical filter may be applied that is transmissive for EUV and less transmissive for or even substantially absorbing of radiation at other wavelengths. Hence, "grating spectral purity filter" is herein further indicated as "spectral purity filter" which includes gratings or transmissive filters. Not depicted in schematic FIG. 2, but also included as an optional optical element may be an optical EUV transmissive filter in illumination system IL and/or projection system PS.

The collector mirror 47 shown in FIG. 2 is a normal-incidence mirror. The collector mirror 47 may comprises Si/Mo multi-layers.

Figure 3:
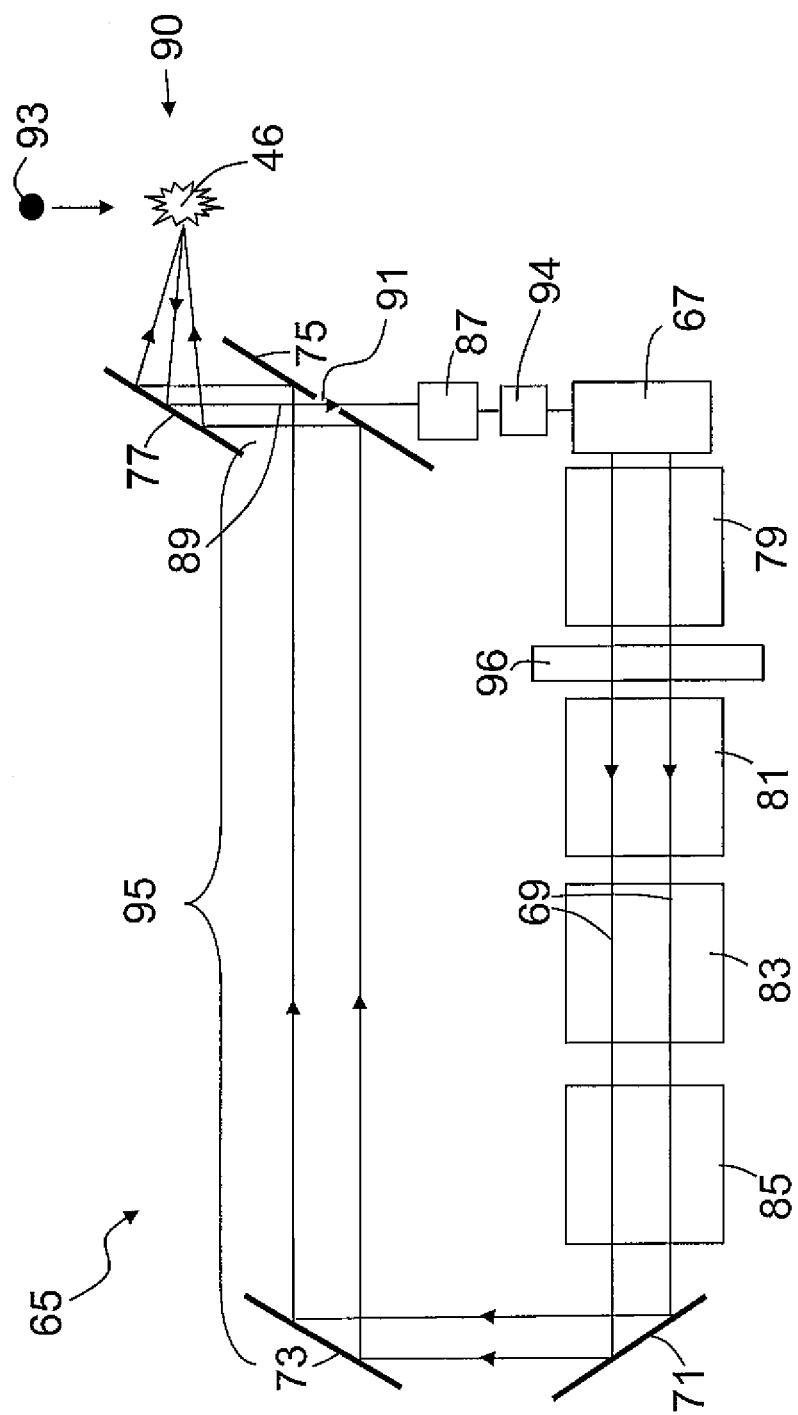
FIG. 3 depicts a laser device of the radiation source of FIG. 2.

FIG. 3 shows an embodiment of a laser device 65, for example a $CO_2$ laser, that may be used to irradiate a droplet of fuel material in order to create the plasma 46. The laser device 65 comprises a seed laser 67 constructed and arranged to generate pulses of laser radiation. Typically, the seed laser may have a power of about 10 W, about 100 W, or about 1000 W. The seed laser may for example be a $CO_2$ laser or a YAG laser. The laser device 65 also comprises mirrors 71, 73, 75, 77 constructed and arranged to direct pulses of laser radiation along a beam path 69 to a plasma generation site 90 where the plasma 46 is to be created. The mirrors 71, 73, 75, 77 may collectively be considered to be a beam delivery system. The beam delivery system may include more mirrors or less mirrors. The beam path 69 may be modified using mirrors of the beam delivery system.

The laser device further comprises amplifiers 79, 81, 83, 85 having gain media constructed and arranged to amplify a power of the laser radiation to a desired power level. The gain media may for example comprise a mixture of helium gas, nitrogen gas and $CO_2$ gas. The laser device 65 may be a $CO_2$ laser. The laser device 65 further comprises a detector 87 constructed and arranged to detect radiation 89 reflected from the droplet of fuel material and to trigger the seed laser 67. The detector 87 may for example be a photomultiplier tube.

The laser device 65 will generate a laser beam when triggered to do so by the seed laser 67. The laser device 65 is self-extinguishing, i.e. generation of the laser beam causes gain media in the amplifiers 79, 81, 83, 85 to be depleted of energy such that the laser device ceases to emit a laser beam. The laser device 65 may therefore be considered to emit pulses of laser radiation.

At intervals between pulses of laser radiation, the laser device 65 will continue to emit radiation at low intensity. Such radiation is commonly referred to as amplified spontaneous emission radiation. A third mirror 75 of the laser device 65 is provided with a hole 91 behind which the detector 87 is located. This allows the detector 87 to detect amplified spontaneous emission radiation which has been reflected from a droplet of fuel material. Alternatively or additionally a notch or a recess may be provided in the third mirror 75, or the third mirror may be provided with a portion which is transparent to the amplified spontaneous emission radiation. The hole, notch, recess and transparent portion may all be considered to be examples of a transmissive portion of the third mirror.

The detector 87 is positioned such that it will receive amplified spontaneous emission radiation which has been reflected from a droplet of fuel material, but will not receive amplified spontaneous emission radiation which has not been reflected from the droplet of fuel material. Non-reflected amplified spontaneous emission radiation will pass through the hole 91 in the third mirror 75, but will not be incident upon the detector 87.

The detector may be positioned behind a different mirror, for example the fourth mirror 77, which may be provided with a transmissive portion. Again, the detector may be positioned such that it will receive amplified spontaneous emission radiation which has been reflected from a droplet of fuel material, but will not receive amplified spontaneous emission radiation which has not been reflected from the droplet of fuel material.

The laser device 65 operates as follows. The seed laser 67, when not emitting a pulse of laser radiation, emits spontaneous emission radiation. This is amplified by the gain media in the amplifiers 79, 81, 83, 85. The amplified spontaneous emission radiation is directed to the plasma generation site 90 by the mirrors 71, 73, 75, 77.

When a droplet of fuel material is present at the plasma generation site 90, the amplified spontaneous emission radiation is reflected from the droplet. The reflected amplified spontaneous emission radiation is reflected by the fourth mirror 77, and passes through the hole 91 in the third mirror 75. The reflected amplified spontaneous emission radiation is thus incident upon the detector 87. The detector, upon receiving the amplified spontaneous emission radiation, triggers the seed laser 67 to generate a pulse of laser radiation. The pulse of laser radiation generated by the seed laser 67 passes through each of the amplifiers 79, 81, 83, 85, each of which increases the intensity of the laser radiation. The resulting high intensity laser radiation passes via the mirrors 71, 73, 75, 77 to the plasma generation site, where it is incident upon a droplet of fuel material. The droplet of fuel material is vaporized, thereby forming a plasma which emits EUV radiation.

If the detector 87 is a photomultiplier tube, the voltage applied to the photomultiplier tube may be reduced after the amplified spontaneous emission radiation has been detected, in order to reduce the sensitivity of the detector before the laser radiation is generated. This reduces the risk that the photomultiplier tube is damaged by the laser radiation. Additionally or alternatively, an acousto-optic or electro-optic element may be provided in front of the detector 87, and may for example be arranged to diffract radiation away from the detector after the amplified spontaneous emission radiation has been detected. This will prevent laser radiation from entering the detector 87, and thus help to protect the detector from damage.

A wavelength selective filter (e.g. a spectral purity filter) may be provided in front of the detector 87. The wavelength selective filter may for example prevent EUV radiation, UV radiation and visible radiation generated by the plasma 46 from entering the detector 87.

The laser device 65 of FIG. 3 allows the seed laser 67, and hence the laser device in general, to be synchronized with the arrival of a droplet of fuel material at the plasma generation site 90. This may allow the laser device 65 to be used in conjunction with a fuel droplet generator that supplies droplets in an irregular manner. It also allows the laser device to be used without using a clocking and/or triggering device which is connected to the fuel material supply 48.

There may be a delay between amplified spontaneous emission radiation being incident upon the detector 87 and the laser radiation being incident upon the droplet of fuel material. To take account of this delay, the laser device 65 may be arranged such that the droplet of fuel material reflects the amplified spontaneous emission radiation before it reaches the plasma generation site 90.

In one example, the delay between amplified spontaneous emission radiation being incident upon the detector 87 and the laser radiation being incident upon the droplet of fuel material is 2 μs. The droplet of fuel material travels at 100 m/s in this example. Thus, the apparatus is configured such that the amplified spontaneous emission radiation is incident upon the droplet of fuel material 200 μm upstream of the plasma generation site 90.

The mirrors 71, 73, 75, 77 of the laser device 65 may include some optical power, such that the amplified spontaneous emission radiation from the amplifiers 79, 81, 83, 85 is focused at a location which is at or adjacent to the plasma generation site 90. This focusing of the amplified spontaneous emission radiation reduces the likelihood that the laser device is triggered too early (this might happen if amplified spontaneous emission radiation was reflected from the droplet of fuel material when the droplet was far away from the plasma generation site 90). A spatial filter may be included in the laser device. The spatial filter may also reduce the likelihood that the laser device is triggered too early.

An delay circuit 94 may be located between the detector 87 and the seed laser 67, for instance, to delay triggering of the seed laser 67 when the reflected amplified spontaneous emission radiation is detected by the detector 87. The delay circuit 94 may be adjustable, and may be used to adjust the time delay between the amplified spontaneous emission radiation being incident upon the detector 87 and the generation of a pulse of laser radiation by the seed laser 67. The delay circuit 94 may be used to synchronize the generation of laser radiation by the laser device 65 with arrival of the droplet of fuel material 93 at the plasma generation site 90.

When the laser radiation is incident upon the droplet of fuel material, a proportion of the laser radiation may be reflected from the droplet of fuel material back into the amplifiers 79, 81, 83, 85 and back to the seed laser 67. This radiation may be so intense that it damages the seed laser 67.

An optical path between the amplifiers 79, 81, 83, 85 and the plasma generation site 90 may include a delay line 95. The delay line 95 increases the elapsed time between generation of laser radiation by the seed laser 67, and laser radiation which has been reflected from the droplet of fuel material entering the amplifiers 79, 81, 83, 85 and the seed laser 67. The term 'delay line' may be interpreted in this context as meaning a portion of the beam path 69 which is longer than would otherwise be required, and which thereby delays the laser radiation from reaching the plasma generation site 90.

The elapsed time may be sufficiently long that gain media in the amplifiers 79, 81, 83, 85 are substantially depleted of energy before the reflected laser radiation enters them. This reduces the likelihood that the amplifiers 79, 81, 83, 85 amplify the reflected laser radiation. If this were to occur then it might generate radiation of sufficiently high intensity that it could damage the seed laser 67. The increased elapsed time provided by the delay line thus reduces the likelihood that the seed laser 67 is damaged by reflected laser radiation.

In one example, 100 ns may be needed in order for the amplifiers 79, 81, 83, 85 to be substantially depleted of energy, and the delay line 65 may be 15 m long in order to allow 100 ns to elapse before reflected pulse radiation enters the amplifiers 79, 81, 83, 85. The delay line may for example have a length which is greater than or equal to 10 m, 20 m, 30 m, 40 m or 50 m.

The elapsed time may be sufficiently long to allow an acousto-optic element 96 to diffract the reflected laser radiation away from the seed laser 67. The acousto-optic element 96 may be triggered by the detector 87 (or an output from the delay circuit 94) such that it is transparent when the laser pulse is emitted from the seed laser 67 but becomes opaque before the laser radiation reflected from the fuel droplet is incident upon it. In this way, the acousto-optic element 96 may prevent reflected laser radiation from damaging the seed laser 67.

In FIG. 3 the acousto-optic element 96 is located between the first and second amplifiers 79, 81. This location is chosen because the laser radiation will have a relatively low intensity at this location (compared with for example a location between the third and fourth amplifiers 83, 85) and is thus less likely to damage the acousto-optic element 96.

Other forms of optical switch may be used instead of the acousto-optic element 96. For example an electro-optic element may be used. The optical switch may be provided at any suitable location.

The laser radiation may be linearly polarized. Where this is the case, a quarter wave plate and a polarizing filter may be used to reduce the amount of laser radiation which is reflected from the droplet of fuel material back into the amplifiers 79, 81, 83, 85. The polarizing filter may be arranged to transmit radiation emitted by the laser, and the quarter wave plate may be arranged to then circularly polarize the laser radiation. The quarter wave plate may be arranged to linearly polarize laser radiation which is reflected from the droplet of fuel material, the direction of linear polarization being transverse to the initial direction of linear polarization of the laser radiation. The reflected laser radiation will thus be blocked by the polarizing filter, and be prevented from passing back into the amplifiers 79, 81, 83, 85 (or may pass back into the amplifiers with a reduced intensity). The polarizing filter may be a conventional polaroid filter, or may alternatively be a Brewster-angled mirror.

Although four amplifiers 79, 81, 83, 85 are shown in FIG. 3, any suitable number of amplifiers may be used. The amplifiers may be considered to be optical amplifiers, since they amplify the laser radiation without first converting it into an electrical signal.

One or more of the mirrors 71, 73, 75, 77 shown in FIG. 3 may be replaced with some other suitable optical element, such as a lens, a grating, etc.

The term extreme ultraviolet (EUV) radiation is intended to include radiation having a wavelength within the range of 5-20 nm, for example within the range of 13-14 nm.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, etc.

The descriptions above are intended to be illustrative, not limiting. Thus, it will be apparent to one skilled in the art that modifications may be made to the present invention as described without departing from the scope of the claims set out below.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not on scale. The present invention is not limited to those elements, shown in the schematic drawings (e.g. the number of mirrors drawn in the schematic drawings). Further, the present invention is not confined to the lithographic apparatus described in relation to FIGS. 1 and 2. It should be appreciated that embodiments described above may be combined.

What is claimed is:

1. A laser device comprising:
   a seed laser;
   an amplifier;
   a detector; and
   an optical element arranged to direct radiation emitted by the seed laser towards a plasma generation site,
   the optical element being arranged to direct towards the detector amplified spontaneous emission radiation which has been emitted by the seed laser and has been reflected from a droplet of fuel material, and
   the detector is arranged to trigger generation of a laser radiation pulse by the seed laser when the reflected amplified spontaneous emission radiation is detected.

2. A laser device according to claim 1, wherein the optical element is a mirror provided with a transmissive portion, behind which transmissive portion the detector is located to detect the reflected amplified spontaneous emission radiation.

3. A laser device according to claim 1, wherein the detector is positioned such that it will, in use, receive amplified spontaneous emission radiation which has been reflected from a droplet of fuel material, but will not receive amplified spontaneous emission radiation which has not been reflected from the droplet of fuel material.

4. A laser device according to claim 1, further comprising a delay circuit to delay triggering of the seed laser when the reflected amplified spontaneous emission radiation is detected.

5. A laser device according to claim 4, wherein the delay circuit is adjustable.

6. A laser device according to claim 1, further comprising optics configured to focus the amplified spontaneous emission radiation at a desired location.

7. A laser device according to claim 1, wherein an optical delay line is provided between the one or more amplifiers and the plasma generation site.

8. A laser device according to claim 7, wherein the optical delay line is sufficiently long that gain media in the one or more amplifiers is substantially depleted of energy before a portion of the laser radiation which is reflected from the droplet of fuel material enters the one or more amplifiers.

9. A laser device according to claim 1, wherein the optical element is a mirror.

10. A laser device according to claim 1, further comprising an optical switch connected to the detector, the optical switch being configured to be triggered by the detector, in use, to transmit the laser radiation pulse generated by the seed laser but to block laser radiation which has been reflected from the droplet of fuel material.

11. A laser device according to claim 1, further comprising a polarizing filter configured to transmit the laser radiation generated by the laser device, and further configured to block a proportion of the laser radiation which has been reflected by the droplet of fuel material.

* * * * *